United States Patent
You et al.

(10) Patent No.: US 11,164,780 B2
(45) Date of Patent: Nov. 2, 2021

(54) PROCESS INTEGRATION APPROACH FOR SELECTIVE METAL VIA FILL

(71) Applicant: APPLIED MATERIALS, INC., Santa Clara, CA (US)

(72) Inventors: Shi You, Sunnyvale, CA (US); He Ren, San Jose, CA (US); Mehul Naik, San Jose, CA (US); Yi Xu, San Jose, CA (US); Feng Chen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 41 days.

(21) Appl. No.: 16/435,121

(22) Filed: Jun. 7, 2019

(65) Prior Publication Data

US 2020/0388533 A1 Dec. 10, 2020

(51) Int. Cl.
*H01L 21/768* (2006.01)
*H01L 21/311* (2006.01)
*H01L 21/02* (2006.01)

(52) U.S. Cl.
CPC .. *H01L 21/76877* (2013.01); *H01L 21/02063* (2013.01); *H01L 21/02068* (2013.01); *H01L 21/31144* (2013.01); *H01L 21/76814* (2013.01); *H01L 21/76846* (2013.01); *H01L 21/76847* (2013.01); *H01L 21/76849* (2013.01)

(58) Field of Classification Search
None
See application file for complete search history.

(56) References Cited

U.S. PATENT DOCUMENTS

| | | | |
|---|---|---|---|
| 6,964,922 B2 | 11/2005 | Lee et al. |
| 6,967,173 B2 | 11/2005 | Smith et al. |
| 7,320,942 B2 | 1/2008 | Chen et al. |
| 7,887,712 B2 | 2/2011 | Boyle et al. |
| 7,922,824 B2 | 4/2011 | Minsek et al. |
| 8,282,842 B2 | 10/2012 | Wang et al. |
| 8,778,797 B2 | 7/2014 | Gao et al. |
| 8,835,326 B2 | 9/2014 | Fitzsimmons et al. |
| 9,123,785 B1 | 9/2015 | Duong et al. |
| 9,613,856 B1 | 4/2017 | Yang et al. |
| 10,026,649 B2 | 7/2018 | Shusterman et al. |

(Continued)

FOREIGN PATENT DOCUMENTS

KR   20000055562 A   9/2000

OTHER PUBLICATIONS

International Search Report for PCT/US2020/033757, dated Sep. 4, 2020.

(Continued)

*Primary Examiner* — Bradley Smith
(74) *Attorney, Agent, or Firm* — Moser Taboada

(57) ABSTRACT

Methods and apparatus for an interconnect formed on a substrate and a method of forming the interconnect thereon. In embodiments, the methods include etching through a hard mask disposed atop a low-k dielectric layer to form a via through the low-k dielectric layer and expose a conductive surface; contacting the conductive surface with dilute hydrofluoric acid to remove contaminants therefrom; removing the hard mask disposed atop the low-k dielectric layer; and applying a remote hydrogen plasma to the conductive surface to form an exposed portion of the conductive surface.

15 Claims, 8 Drawing Sheets

(56) References Cited

U.S. PATENT DOCUMENTS

| | | |
|---|---|---|
| 10,035,978 B2 | 7/2018 | Oie et al. |
| 10,138,117 B2 | 11/2018 | Chen et al. |
| 2006/0003486 A1 | 1/2006 | Lai et al. |
| 2006/0091355 A1 | 5/2006 | Itano et al. |
| 2006/0138399 A1* | 6/2006 | Itano ............... C11D 7/265 257/40 |
| 2007/0082477 A1* | 4/2007 | Naik ............. H01L 21/76808 438/622 |
| 2008/0286965 A1* | 11/2008 | Lee ............... H01L 21/76849 438/643 |
| 2012/0100716 A1 | 4/2012 | Srivastava et al. |
| 2014/0349478 A1* | 11/2014 | Koschinsky ...... H01L 21/76828 438/637 |
| 2017/0053864 A1 | 2/2017 | Peng et al. |
| 2017/0110368 A1 | 4/2017 | Yu et al. |
| 2018/0315650 A1 | 11/2018 | Ren et al. |

OTHER PUBLICATIONS

PCT International Search Report dated PCT/US2018/028036, dated Jan. 7, 2019.

\* cited by examiner

PROCESS INTEGRATION APPROACH FOR SELECTIVE METAL VIA FILL

FIELD

Embodiments of the present disclosure generally relate to an improved method of forming interconnects.

BACKGROUND

Reliably producing sub-100 nm and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success, and to the continued effort to increase circuit density and quality of individual substrate and die.

As circuit densities increase for next generation devices, the widths of interconnects, such as vias, trenches, contacts, gate structures, and other features, as well as the dielectric materials there between, decrease to 45 nm and 32 nm dimensions or below, whereas the thickness of the dielectric layer remain substantially constant, with the result of increasing the aspect ratios of the features. In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. 3D stacking of semiconductor chips reduces wire lengths and keeps wiring delay low. In manufacturing, 3D stacking of semiconductor chips, stair-like structures are often utilized to allow multiple interconnection structures to be disposed thereon, forming high-density of vertical transistor devices.

Moreover, conductive surfaces, such as copper surfaces or cobalt surfaces, formed at the bottom of a via during stack formation are typically contaminated with etching byproducts and residues formed during via opening and subsequent metal hard mask removal. While large sized particles may be removed by a subsequent dry clean process, the atomic level contamination from etching related elements such as oxygen, fluorine, and carbon or from oxidation due to air exposure on the conductive interconnect surface cannot be removed by a dry clean process.

Typically, the fluorine, oxygen, and carbon contamination can be removed through wet clean methods. However, the inventors have observed that these techniques are not useful for newer back end of the line (BEOL) processes due to compatibility issues with low-k dielectrics as well as recent tighter requirements on low-k damage (e.g., carbon depletion issues). Accordingly, there is a continuous need for post via etch cleaning techniques to improve electrical performance.

Further, the inventors have observed that conventional via formation leads to a high resistance due to the materials used in process integration. For example, filling both via and a trench connected thereto with the same material leads to high interconnect resistance, which may undesirably lead to a resistive-capacitive delay (RC delay) and voltage drop (IR drop) in semiconductor chips. Moreover, positioning of the barrier and liner layer may lead to high resistivities, for example leading to a high via resistance when deposited at a via bottom.

Thus, there is a continual need for improved methods of forming interconnects to decrease the manufacturing costs, memory cell size, and power consumption of the integrated circuits.

SUMMARY

Methods and apparatus for forming interconnects are provided herein. In some embodiments, a method of forming an interconnect, includes: etching through a hard mask disposed atop a low-k dielectric layer to form a via through the low-k dielectric layer and expose a conductive surface; contacting the conductive surface with dilute hydrofluoric acid to remove contaminants therefrom; removing the hard mask disposed atop the low-k dielectric layer; and applying a remote hydrogen plasma to the conductive surface to form an exposed portion of the conductive surface.

In some embodiments, a method of forming an interconnect, includes: forming a via and a trench in a film stack including a hard mask and a dielectric layer disposed on a substrate to expose a conductive surface; contacting the conductive surface with dilute hydrofluoric acid; removing the hard mask; applying a remote plasma to the conductive surface to form an exposed portion of the conductive surface; depositing a first metal of a first type in the via; depositing a barrier layer upon the first metal and exposed surfaces of the trench; depositing a liner layer upon the barrier layer; and filling the trench with a second metal different than the first metal.

In some embodiments, a non-transitory computer readable medium having instructions stored thereon that, when executed, cause a method of forming an interconnect, includes: etching through a hard mask disposed atop a low-k dielectric layer to form a via through the low-k dielectric layer and expose a conductive surface; contacting the conductive surface with dilute hydrofluoric acid to remove contaminants therefrom; removing the hard mask disposed atop the low-k dielectric layer; and applying a remote hydrogen plasma to the conductive surface to form an exposed portion of the conductive surface.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
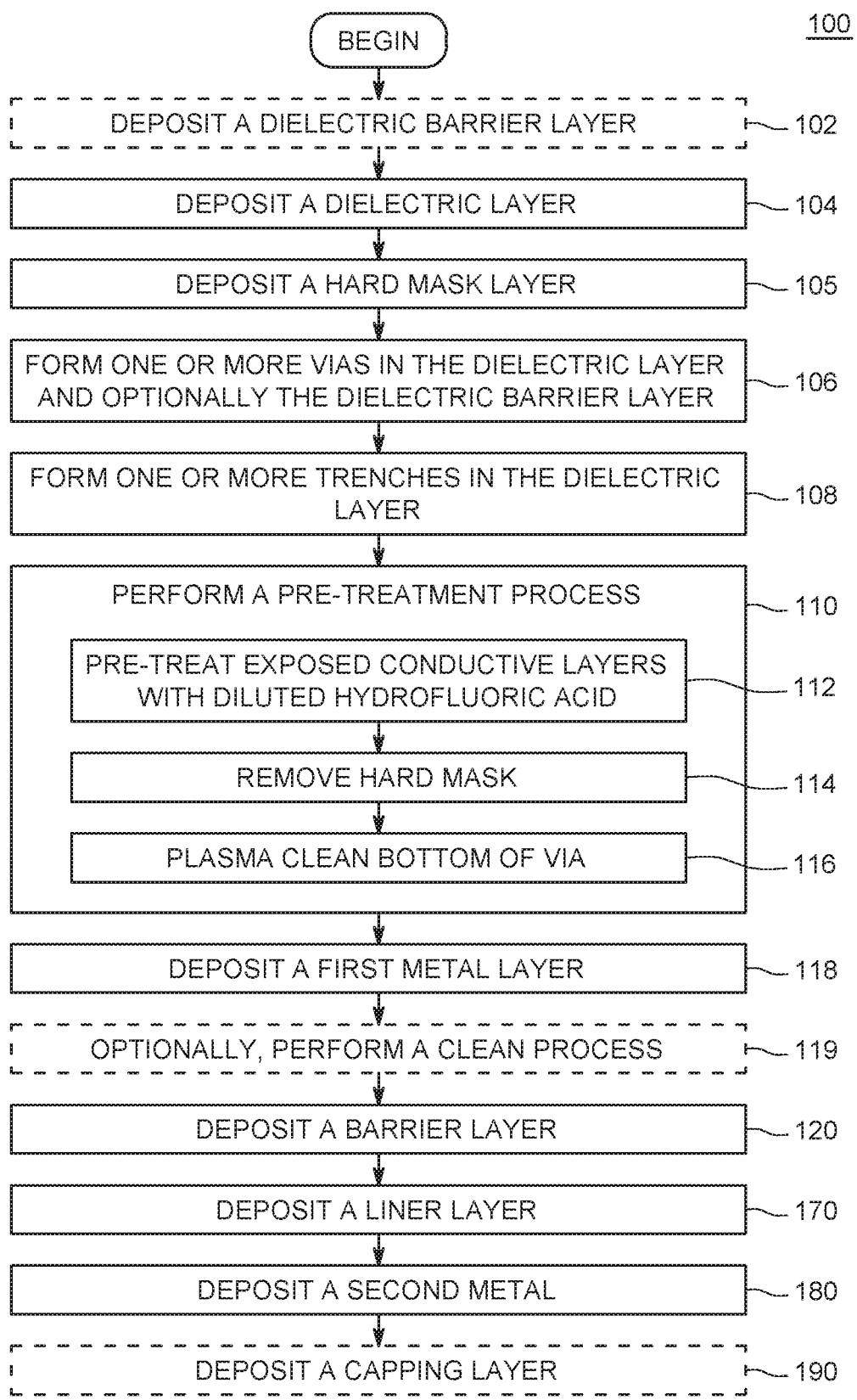
FIG. 1 illustrates a method of forming an interconnect according to one embodiment of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for processing a substrate are provided herein. Embodiments of the present disclosure advantageously facilitate cleaning and/or reducing (such as the partial or complete removal of oxygen) the conductive interconnect surface while maintaining low-k integrity, electrical conductivity and reliability for IC interconnect structures. In embodiments, varying the materials used in a via and a trench connected thereto reduces or eliminates RC delay and IR drop in semiconductor chips. Further, placement of the barrier and liner layers between a via and a trench connected thereto reduces via resistance. The methods of the present disclosure may be utilized in the formation of metal interconnects in an integrated circuit, or in the formation of a metal gate or a metal-contact gap fill process, as well as other suitable applications where metal cleaning or reduction may be performed in a via hole.

FIG. 1 depicts a flow chart of a method 100 for processing a substrate in accordance with some embodiments of the present disclosure. The method 100 is described below with respect to the stages of processing a substrate as depicted in FIGS. 2A-2K which illustrate cross-sectional views of the substrate prior to, and at different stages of, the method 100 of FIG. 1 and may be performed, for example, in a suitable reactor, such as is described below with respect to FIG. 3, Exemplary processing systems that may be used to perform the methods disclosed herein may include, but are not limited to, any of the ENDURA®, CENTURA®, or PRODUCER® line of processing systems, commercially available from Applied Materials, Inc., of Santa Clara, Calif. Other process chambers, including ones available from other manufacturers, may also be suitably used in connection with the teachings provided herein.

Figure 2A:
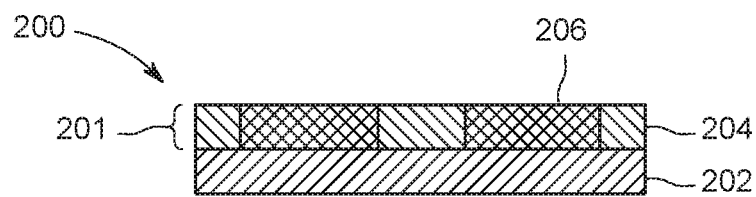
FIGS. 2A-2K illustrate side cross-sectional views of an interconnect formed on a substrate at different stages of the method of FIG. 1 according to one embodiment of the present disclosure.

FIG. 2A illustrates a cross-sectional view of an interconnect 200 prior to commencement of method 100. Generally, the interconnect 200 includes multiple film layers that may be utilized to form an interconnect structure, such as a dual damascene structures. A film stack 201 is formed on a substrate 202. The film stack 201 includes a second dielectric layer 204. The second dielectric layer 204, as shown in FIG. 2A, is disposed on the substrate 202 and has a conductive layer 206 formed in, and bounded by, the second dielectric layer 204. In one example, the second dielectric layer 204 may be formed from one or more insulating materials such as silicon oxide. In one example, the conductive layer 206 may be formed from a conductive layer, such as copper or cobalt.

Figure 2B:
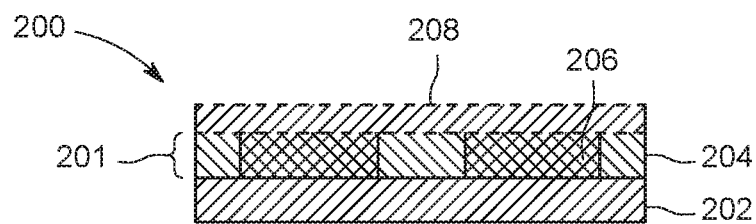

Referring back to FIG. 1, at block 102, a dielectric barrier layer 208 may optionally be deposited on the substrate 202, as illustrated in FIG. 2B. For example, as illustrated, the dielectric barrier layer 208 is deposited over both the second dielectric layer 204 and the conductive layer 206. Accordingly, the dielectric barrier layer 208 may formed a uniform, uninterrupted, layer over the second dielectric layer 204 and the conductive layer 206. The dielectric barrier layer may be formed from a low-k material. For example, the dielectric barrier layer 208 may be formed from a carbon containing silicon layer (SiC), a nitrogen doped carbon containing silicon layer (SiCN), a silicon nitride layer, a metal nitride or metal oxide (e.g., AlN, AlOx, AlON), or the like.

Figure 2C:
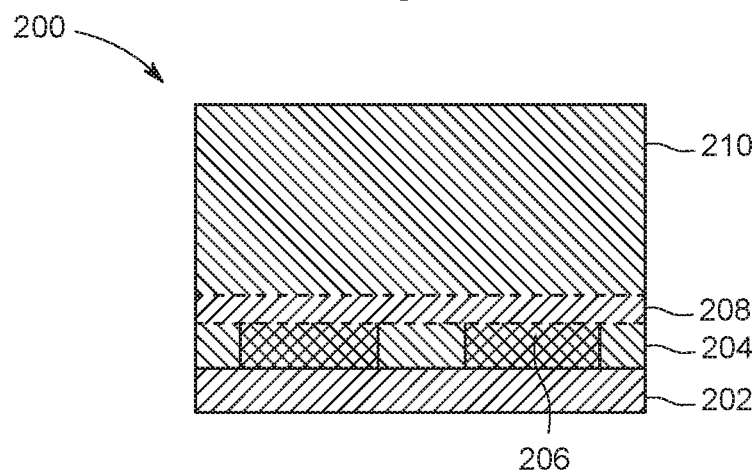

Referring now to block 104, a dielectric layer 210 is deposited on the substrate 202, as illustrated in FIG. 2C. For example, as illustrated, the dielectric layer 210 is deposited over the dielectric barrier layer 208. The dielectric layer 210 may be substantially similar to second dielectric layer 204. In one embodiment, dielectric layer 210 may be formed from the same material as second dielectric layer 204. In another embodiment, dielectric layer 210 may be formed from a different material than second dielectric layer 204, while maintaining the same low-k properties. In another example, the dielectric layer 210 may be formed from a low-k material (e.g., a material having a dielectric constant less than silicon oxide, or less than about 3.9), or the like. In embodiments, dielectric layer 210 is a dense material such as Black Diamond® 1 brand low-k material available from Applied Materials, Inc.

Figure 2D:
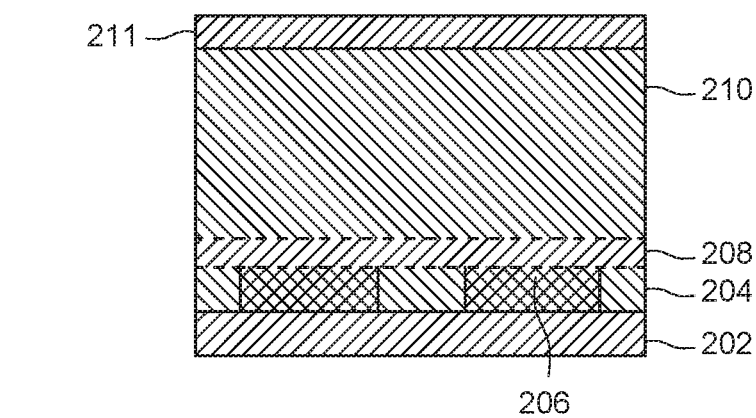

Referring now to block 105, a hard mask 211 is disposed atop the dielectric layer 210 which may be a low-k dielectric layer as illustrated in FIG. 2D. For example, as illustrated, the hard mask 211 is deposited over the dielectric layer 210. In one embodiment, hard mask 211 may be formed from any suitable hard mask material. Accordingly, the hard mask 211 may form a uniform, uninterrupted, layer directly atop the dielectric layer 210 and over the conductive layer 206. In embodiments, the hard mask 211 is a dielectric material (e.g., $SiO_2$, SiCO, SiON, or SIC), an inter-metal/metal material (e.g., TiN or Ti), or a combination of the dielectric material and the inter-metal/metal material. In some embodiments, the hard mask 211 is a layer formed of titanium nitride (TiN) or tantalum nitride (TaN). In embodiments, the hard mask 211 has a thickness of 15 to 25 nanometers.

Figure 2E:
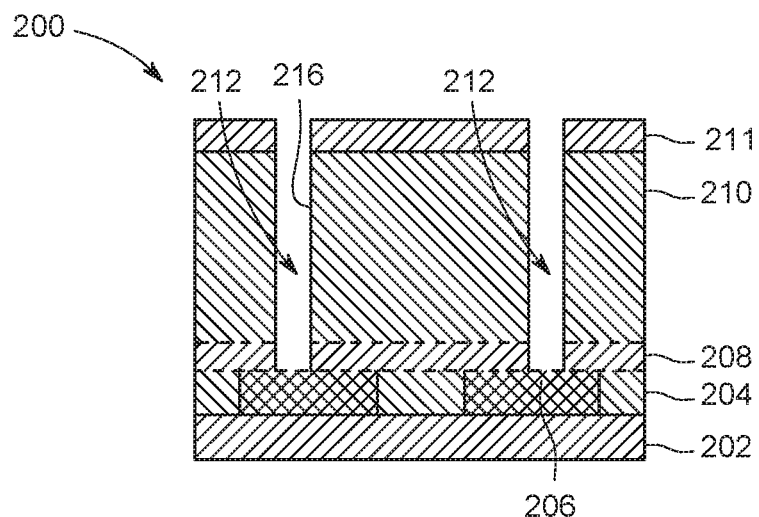

At block 106, one or more vias 212 are formed in the interconnect 200 to expose the conductive layer 206, as illustrated in FIG. 2E. For example, the vias 212 may be formed through the hard mask 211, dielectric layer 210 and the optional dielectric barrier layer such as dielectric barrier layer 208 to expose the underlying conductive layer 206. In embodiments, the present disclosure includes etching through a hard mask 211 disposed atop a low-k dielectric layer such as dielectric layer 210 to form a via 212 through the low-k dielectric layer and expose a conductive surface such as conductive layer 206. Generally, the vias 212 have a width, W1. In some embodiments, the width of each via 212 is uniform an entire length of the via 212. In other embodiments, the width of each via 212 may change gradually from a top of the via 212 to a bottom of the via 212. In embodiments, via 212 has a high aspect ratio.

Figure 2F:
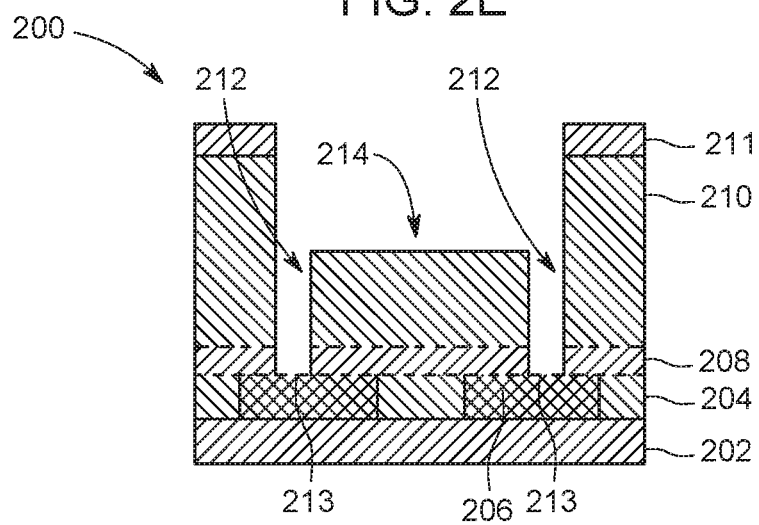
Figure 2G:
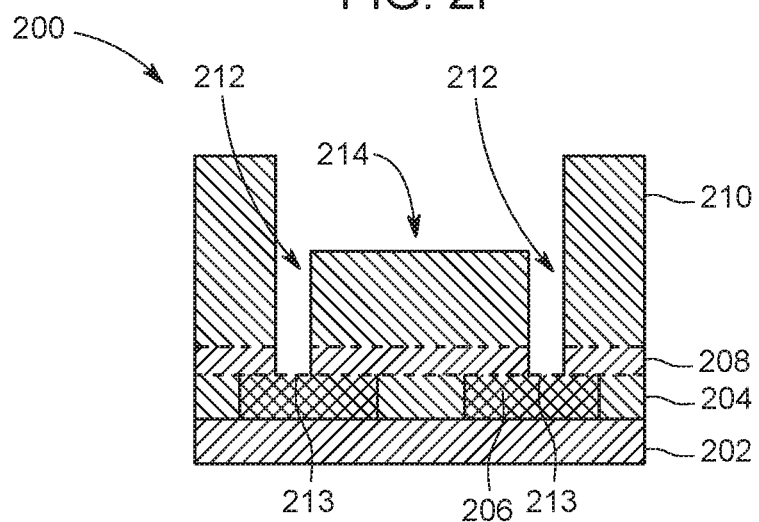

At block 108, one or more trenches 214 are formed in the interconnect 200, as illustrated in FIG. 2F. The one or more trenches 214 may be formed through the hard mask 211 and into the dielectric layer 210. In embodiments, the one or more trenches 214 are configured to widen at least a portion of the via 212. In some embodiments, block 108 may be performed prior to block 106, i.e., the trenches 214 may be formed before the vias 212. In other embodiments, the one or more trenches 214 are formed subsequent to the forming of the via 212 or one or more vias.

Embodiments of the present disclosure include a selective fill approach (e.g., a copper or tungsten fill approach) demonstrating a lower via resistance while simultaneously meeting integration and reliability requirements. An interface treatment (discussed below in conjunction with at least block 110) and fill process (discussed below in conjunction with at least block 118) are developed to selectively grow a metal material (e.g., Cu, or W) from a via bottom without damaging an underlying metal layer (e.g., Cu, VV, Co, and the like) and surrounding dielectrics (e.g., low-k dielectrics, oxides, and the like). As a result, the below discussion provides one or more techniques to lower via resistance. In embodiments, following the via fill, a damascene fill will follow, which aids in forming an equivalent line resistance.

In embodiments, the method 100 includes at block 110, one or more pre-treatment processes performed on the interconnect 200 to prepare the interconnect 200 to receive a selective metal via such as via 212 fill. For example, block 110 may include sub-blocks 112-116.

At sub-block 112, the interconnect 200 undergoes a first treatment process for the exposed portion 213 of the conductive surface of conductive layer 206 in the via 212. For example, the first pretreatment process is used to prepare the exposed portion 213 of the conductive layer 206 for a bottom-up growth when the via 212 is deposited with a first metal. In embodiments, the exposed portion 213 of conductive layer 206 in via 212 is contacted with a diluted hydrofluoric acid (DHF) under conditions suitable for removing contaminants. For example, the conductive surface such as exposed portion 213 is contacted with dilute hydrofluoric acid to remove contaminants therefrom. In embodiments, a diluted hydrofluoric acid (DHF) treatment is employed, HF in the form of diluted buffered oxide etchant (BOE) is applied to the conductive surfaces. The diluted hydrofluoric acid (DHF) treatment may be accomplished by filling a tank with diluted hydrofluoric acid (DHF) and then immersing the interconnect 200 into the tank. To prevent streaking, the interconnect 200 should be quickly immersed in the HF bath. In embodiments, diluted hydrofluoric acid (DHF) acts to strip the oxide, removing metals that are less electronegative than silicon. In embodiments, the interconnect 200 including the film stack are treated for a duration of about 30 to 60 seconds before the solution is quickly dumped to a discharge tank or recycling unit. In embodiments, the dilute hydrofluoric acid has a pH of 2-4, about 3, or 3. In embodiments, the dilute hydrofluoric acid has a molarity of 0.01-0.5 M. In embodiments, the dilute hydrofluoric acid is applied to the film stack at room temperature for a duration of 10 to 30 seconds, or 10 to 20 seconds.

Referring back to FIG. 1 and FIG. 2G, subsequent to the first treatment process for the exposed portion 213 of the conductive layer 206 in the via, at block 114 the hard mask is removed. In embodiments, the hard mask is removed by a wet etch removal process, for example, where a hard mask is contacted with a wet etch solution under conditions to remove the hard mask material. In embodiments, hard mask disposed atop a low-k dielectric layer such as dielectric layer 210 is removed. In some embodiments, the hard mask is removed by contacting the hard mask with a removal composition for removing a hard mask. In one embodiment, the removal composition is a wet-etch solution that removes a metal hard mask on a dielectric layer without attacking the exposed portion 213 of the conductive layer 206 in the via and without attacking the dielectric layer 210. In some embodiments, the hard mask is removed by contacting the hard mask with a peroxide (such as $H_2O_2$) containing alkaline chemistry, high pH (e.g., pH 9-11), under conditions suitable to strip away the hard mask. In embodiments, the removal composition is a wet-etch solution that removes a titanium nitride hard mask. In embodiments, the removal composition is a wet-etch solution that removes a TaN hard mask. In embodiments, a removal composition includes corrosion inhibitors to prevent oxidation activity toward the exposed portion 213 of the conductive layer 206. In some embodiments, metal corrosion inhibitors are provided to prevent oxidation of copper, cobalt and/or other metals suitable for use as conductive layer 206. Non limiting examples of metal corrosion inhibitors include 5-amino-I, 3,4-thiadiazole-2-thiol (ATDT), benzotriazole (BTA), 1,2,4-triazole (TAZ), tolyltriazole, 5-methyl-benzotriazole (MBTA), and the like. In embodiments, the hard mask 211 such as TIN or TaN is removed, without hard mask material remaining on the dielectric layer 210. In some embodiments, a non-limiting wet-etch solution for use herein includes SELECTIPUR® S-Series brand solution from BASF.

Still referring to FIG. 1, subsequent to the hard mask removal, at block 116, a plasma cleaning process is applied to the exposed portion of the conductive layer in the via. In embodiments, a remote plasma clean process may be used to treat the interconnect subsequent to the hard mask removal. For example, a remote hydrogen plasma may be applied to a conductive surface to form an exposed portion of the conductive surface, for example where the exposed portion or surface has oxide removed therefrom. In embodiments, the plasma clean includes a low density hydrogen plasma clean, for example under conditions suitable for removing metal oxide such as copper oxide from exposed portion 213 of the conductive layer 206. In some embodiments, the interconnect 200 may be transferred to a treatment chamber where the interconnect 200 undergoes the plasma cleaning process. For example, the interconnect may undergo a cleaning process between about 150-250° C., using $H_2$ or hydrogen radicals, at a pressure of about 1-10 Torr. In other embodiments, a slight bias energy may be applied to facilitate oxide knock-off without metal sputtering. For example, an energy of 0-200 W may be applied to the pre-treatment chamber. In some embodiments, an alcohol such as methanol and/or ethanol may also be applied under conditions suitable for removing metal oxide such as copper oxide from exposed portion 213 of the conductive layer 206. For example, in combination with the remote plasma clean process used to treat the interconnect subsequent to the hard mask removal, the interconnect may be contacted with ethanol and/or methanol in a thermal soak at a temperature in the amount of 150-250° C. In embodiments, a thermal alcohol soak is applied for 30 seconds to 1 hour.

In one embodiment, a suitable chamber for a plasma cleaning process in accordance with the present disclosure includes the AKTIV®Preclean ("APC") chamber of, for example, the ENDURA® CuBS (copper barrier/seed) system available from Applied Materials, Inc. In embodiments, the plasma cleaning process suitable for use herein provides a benign and efficient cleaning process for removal of polymeric residues and/or reaction of metal oxide such as copper oxide ("CuO") for metal low-k interconnect process schemes for 28 nm generation and below nodes. In embodiments, APC is designed to effectively remove polymeric residues and reduce Cu© deposits while preserving the integrity of porous low and ultra-low k inter-level dielectric ("ILD") films.

Figure 2H:
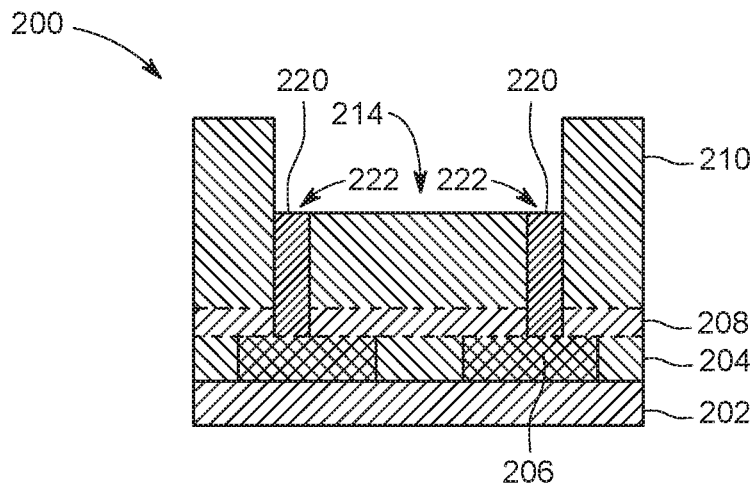

Referring back to FIG. 1, after method 100, at block 110, where one or more pre-treatment processes are performed on the interconnect 200 to prepare the interconnect 200 to receive a selective metal via such as via 212 fill, a first metal layer is deposited in the one or more via as shown at block 118. At block 118, a first metal 220 selectively fills the via 212, as illustrated in FIG. 2H. For example, a first metal 220 material is deposited in the via 212 up to a point 222 where the via 212 meets the trench 214. The first metal 220 used may be any suitable metal material such as ruthenium (Ru), tungsten (W), cobalt (Co), aluminum (Al), Copper (Cu), or the like. In some embodiments, first metal 220 is a different material as the subsequent metal deposited in the trench 214. Selectively depositing the first metal 220 in the via aids in reducing the via resistance, and meeting reliability and line resistance requirements.

The first metal 220 may be deposited using a chemical vapor deposition (CVD) process. In embodiments, a suitable CVD process for use herein may include an $H_2$ pre-soak at elevated temperatures (e.g., 350-500° C.). In some embodiments, the CVD process may be performed at temperatures of about 200-500° C., using a low flow rate (e.g., 2-100 sccm) of a metal-containing precursor (e.g., $WF_6$) in a vast H2 ambient environment. In embodiments, a metal-containing precursor is preselected to form at least one of ruthenium (Ru), tungsten (W), cobalt (Co), aluminum (Al), Copper (Cu) in the via. The combination of flow rate, pressure, and temperature aids in reducing morphology of the first metal 220 when deposited. Prior to the first metal 220 material being deposited, a conventional nucleation layer may be applied for the initial 1-3 nm of nucleation. The overall growth amount is controlled by process time, pressure, and precursor flow to uniformly fill the via 212.

In some embodiments, method 100 may include an optional block such as block 119, performed prior to deposition of additional layers or second metal 224. At block 119, the interconnect 200 may undergo a pre-treatment process prior to the second metal 224. In some embodiments, the process of the present disclosure may include a process sequence at block 119 where the top surface of the metal filled via undergoes an optional post-deposition clean. For example, the optional clean may be used in case of oxidation or residue growth at a top surface of the via 212 e.g., at an exposed surface such as point 222 where the via 212 meets the trench 214. In embodiments, the optional pre-treatment clean uses a peroxide ($H_2O_2$) containing chemistry with alkaline pH tuning to slightly strip away the residue. In some embodiments, a plasma cleaning process may be performed prior to deposition of additional layers or second metal 224. For example, plasma cleaning may optionally include use of the the AKTIV®Preclean ("APC") chamber available from Applied Materials, Inato provide a benign and efficient cleaning process for removal of metal oxide or native oxide formed atop the first metal 220 filled in via 212, or exposed portion thereof. For example, if the via is filled with cooper, a plasma cleaning step may be applied to remove copper oxide ("CuO") at point 222 where the via 212 meets the trench 214.

Figure 2I:
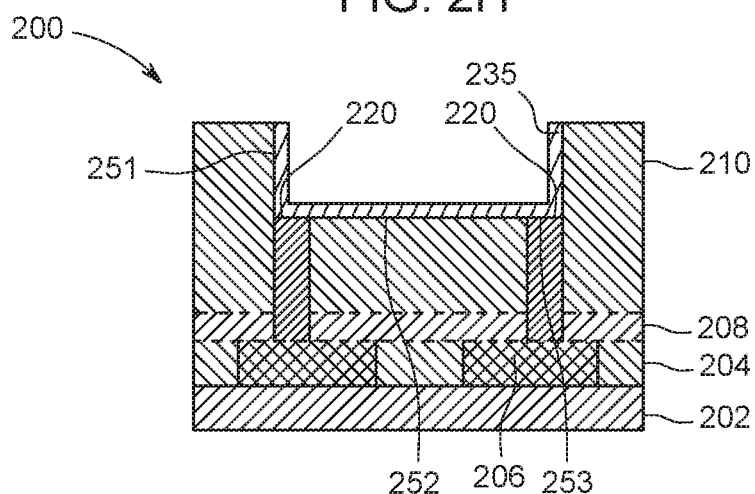

Referring to FIG. 1 at block 120 and FIG. 2I, trench 214 may be covered with one or more barrier layers 235. For example, the sidewall(s) 251 of the trench the bottom surface 252 of the trench including the exposed metal surface 253 of via 212 may be covered by a barrier layer 235. The barrier layer 216 may serve to prevent diffusion of a subsequently deposited metal into underlying layers, such as dielectric layer 210. The barrier layer 235 may include any material suitable to act as a barrier. For example, in some embodiments, the barrier layer 235 may include a metal, for example, titanium (Ti), tantalum (Ta), cobalt (Co) such as CVD deposited cobalt), manganese (Mn), tungsten (W), hafnium (Hf), alloys thereof, or the like, or in some embodiments, a metal nitride, such as titanium nitride (TiN), tantalum nitride (TaN), tungsten nitride (WN), or the like. The barrier layer 235 may have any thickness suitable to prevent the diffusion of subsequently deposited metal layer materials into underlying layers. For example, in some embodiments, the barrier layer 235 layer may have a thickness of about 10 to about 20 angstroms, or 10 to 15 angstroms. The barrier layer 235 may be formed by any process suitable to provide the barrier layer 235 having a suitable thickness. For example, in some embodiments, the barrier layer 235 may be formed via a deposition process, such as chemical vapor deposition, physical vapor deposition, or a cyclical deposition process, for example, such as atomic layer deposition, or the like. In embodiments, the barrier layer 235 comprises one of more layers of TaN deposited by atomic layer deposition (ALD) process. In embodiments, an ALD process may deposit TaN to form barrier layer 235, or one or more layers of barrier layer 235 to a thickness sufficient to function as a barrier layer. In embodiments, barrier layer 235 comprises a layer of material conformally deposited atop the internal trench surfaces.

Figure 2J:
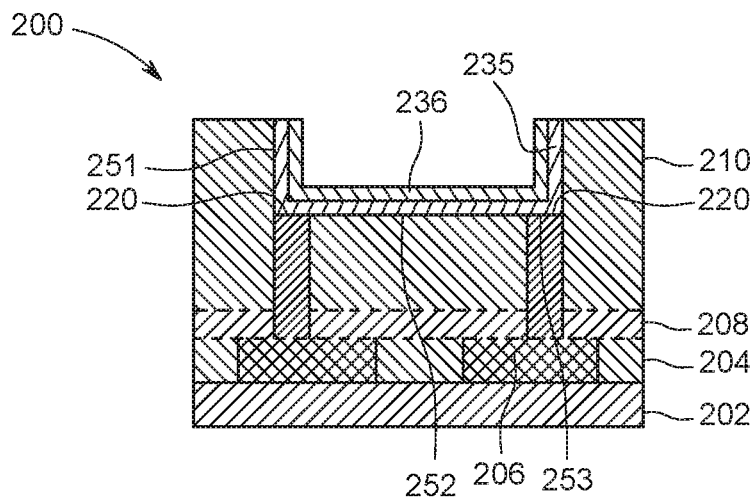

Referring to FIG. 1 at block 170 and FIG. 2J, barrier layer 235 may be covered in one or more liner layers such as liner layer 236. In some embodiments, the interconnect 200 may include a liner layer 236 including cobalt disposed atop the barrier layer 235. In embodiments, liner layer 236 may be formed by a CVD or PVD process performed in a process chamber to provide a liner layer having a predetermined thickness over the surface of the barrier layer within the trench. In embodiments, liner layer 236 is a cobalt layer deposited via a physical vapor deposition (PVD) process atop sidewalls and a bottom surface of a trench. In embodiments, the liner layer is deposited to a thickness of 20 to 40 angstroms such as 30 angstroms. In embodiments, the liner layer is cobalt deposited to a thickness of 20 to 40 angstroms such as 30 angstroms. In some embodiments, liner layer 236 such as a cobalt layer is conformally deposited to cover the barrier layer 235.

Figure 2K:
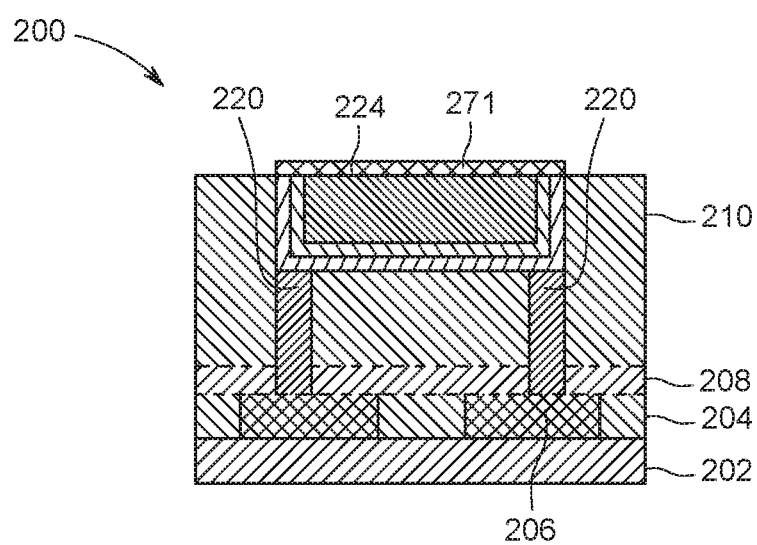

Referring back to FIG. 1, at block 180, and FIG. 2K, a second metal 224 is deposited in each trench 214. For example, the second metal 224 is deposited atop liner layer 236 to a top of the trench 214. The second metal 224 used may be any suitable metal material such as ruthenium (Ru), tungsten (W), cobalt (Co), aluminum (Al), copper (CU), and the like. In some embodiments, second metal 224 is a different material as the first metal 220 material deposited in the via 212. In some embodiments, second metal 224 is the same material as the first metal 220 material deposited in the via 212. In embodiments, the second metal 224 may be deposited using a CVD process. Bifurcating the conventional metal fill of a singular metal material into a multistep process involving a first metal 220 deposited in the via 212, a second metal 224 deposited in the trench 214 and a barrier layer/liner layer disposed between the first metal 220 and second metal 224 aids in decreasing the resistance through the via 212.

Still referring to FIG. 2K, a capping layer 271 may be deposited atop the second metal. In embodiments, the capping layer comprises cobalt, ruthenium or other suitable capping material.

Figure 3:
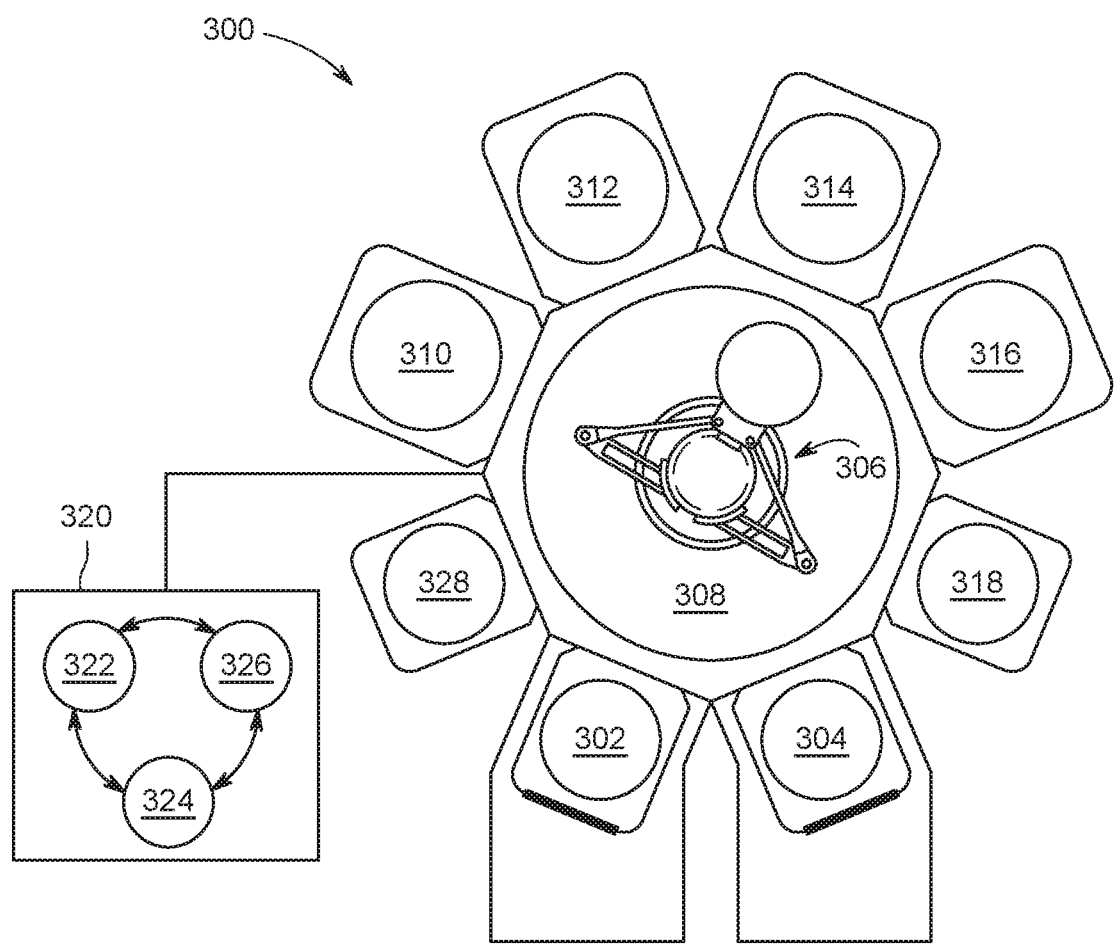
FIG. 3 illustrates a multi-chamber processing system on which the method of FIG. 1 can be practiced, according to one embodiment of the present disclosure.

FIG. 3 illustrates a multi-chamber processing system as processing system 300. The processing system 300 may include load lock chambers 302, 304, a robot 306, a transfer chamber 308, processing chambers 310, 312, 314, 316, 318, 328, and a controller 320. The load lock chambers 302, 304 allow for the transfer of substrates (not shown) into and out of the processing system 300. Load lock chambers 302, 304 may pump down the substrates introduced into the processing system 300 to maintain a vacuum seal. The robot 306 may transfer the substrates between load lock chambers 302, 304 and the processing chambers 310, 312, 314, 316, 318, and 328. The robot 306 may also transfer the substrates between the load lock chambers 302. 304 and the transfer chamber 308.

Each processing chamber 310, 312, 314, 316, 318, and 328 may be outfitted to perform a number of substrate operations such as atomic layer deposition (ALD), chemical vapor deposition (CVD), PVD, etch, pre-clean, de-gas, heat, orientation, or other substrate processes. Additionally, each processing chamber 310, 312, 314, 316, 318, and 328 may be outfitted to deposit a dielectric barrier layer, deposit a dielectric layer, form one or more vias and trenches in the stack, perform one or more pre-clean processes, deposit the first metal material layer, deposit a liner layer, deposit a barrier layer, deposit the second metal material layer, or deposit a capping layer.

The controller 320 may be configured to operate some or all aspects of the processing system 300, including the method disclosed in FIG. 1. For example, the controller 320 may be configured to control the method of forming an interconnect on a substrate. The controller 320 includes a programmable central processing unit (CPU) 322 that is operable with a memory 324 and a mass storage device, an input control unit, and a display unit (not shown), such as power supplies, clocks, cache, input/output (I/O) circuits, and the liner, coupled to the various components of the processing system to facilitate control of the substrate processing. The controller 320 also includes hardware for monitoring substrate processing through sensors in the processing system 300, including sensors monitoring the precursor, process gas, and purge gas flow. Other sensors that measure system parameters, such as substrate temperature, chamber atmosphere pressure, and the like, may also provide information to the controller 320.

To facilitate control of the processing system 300 described above, the CPU 322 may be one of any form of general purpose computer processor that can be used in an industrial setting, such as a programmable logic controller (PLC), for controlling various chambers and sub-processors. The memory 324 is coupled to the CPU 322 and the memory 324 is non-transitory and may be one or more of readily available memory such as random access memory (RAM), read only memory (ROM), floppy disk drive, hard disk, or any other form of digital storage, local or remote. Support circuits 326 are coupled to the CPU 322 for supporting the processor in a conventional manner. Charged species generation, heating, and other processes are generally stored in the memory 324, typically as software routine. The software routine may also be stored and/or executed by a second CPU (not shown) that is remotely located from the hardware being controlled by the CPU 322.

The memory 324 is in the form of computer-readable storage media that contains instructions, that when executed by the CPU 322, facilitates the operation of the processing system 300. The instructions in the memory 324 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

The method discussed above may not be tied solely to the processing system 300. For example, one or more blocks, such as block 120 or block 114, may be performed in a processing chamber exterior to the processing system 300.

In some embodiments, the present disclosure includes a non-transitory computer readable medium having instructions stored thereon that, when executed, cause a method a method of forming an interconnect, including: etching through a hard mask disposed atop a low-k dielectric layer to form a via through the low-k dielectric layer and expose a conductive surface; contacting the conductive surface with dilute hydrofluoric acid to remove contaminants therefrom; removing the hard mask disposed atop the low-k dielectric layer; and applying a remote hydrogen plasma to the conductive surface to form an exposed portion of the conductive surface.

Figure 4:
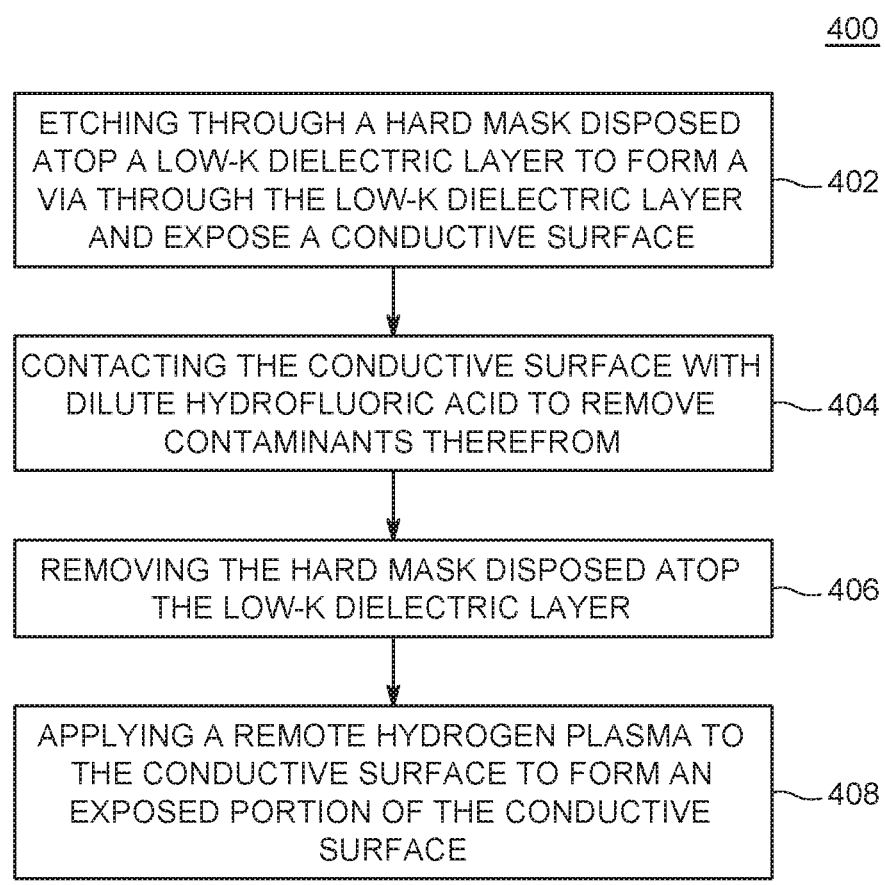
FIG. 4 illustrates a method of forming an interconnect according to one embodiment of the present disclosure.

Referring now to FIG. 4, in some embodiments, the present disclosure includes a method 400 of forming an interconnect. The method 400 includes at block 402 etching through a hard mask disposed atop a low-k dielectric layer to form a via through the low-k dielectric layer and expose a conductive surface. Next, at block 404 method 400 includes contacting the conductive surface with dilute hydrofluoric acid to remove contaminants therefrom. At block 406 method 400 includes removing the hard mask disposed atop the low-k dielectric layer. At block 406 method 400 includes and applying a remote hydrogen plasma to the conductive surface to form an exposed portion of the conductive surface. In some embodiments, the process sequences of blocks 402, 404, 406, and 408 occur sequentially as shown in FIG. 4. In some embodiments, contacting the conductive surface with dilute hydrofluoric acid to remove contaminants therefrom is performed before removing the hard mask disposed atop the low-k dielectric layer. In some embodiments, removing the hard mask disposed atop the low-k dielectric layer is performed before applying a remote hydrogen plasma to the conductive surface to form an exposed portion of the conductive surface. In some embodiments, the dilute hydrofluoric acid is a 100 to 1000:1 dHF solution. In some embodiments, the methods include depositing a first metal of a first type in the via. In embodiments, the first metal of a first type is one of ruthenium, tungsten, cobalt, aluminum, or combinations thereof. In embodiments, the methods include forming a trench in communication with the via. In embodiments, the methods include depositing a barrier layer within the trench and atop the exposed portion of the conductive surface. In embodiments, the methods include depositing a liner layer atop the barrier layer. In embodiments, the methods include filling a trench with a second metal different than the first metal of a first type. In embodiments, the methods include adding a capping layer atop the second metal.

Figure 5:
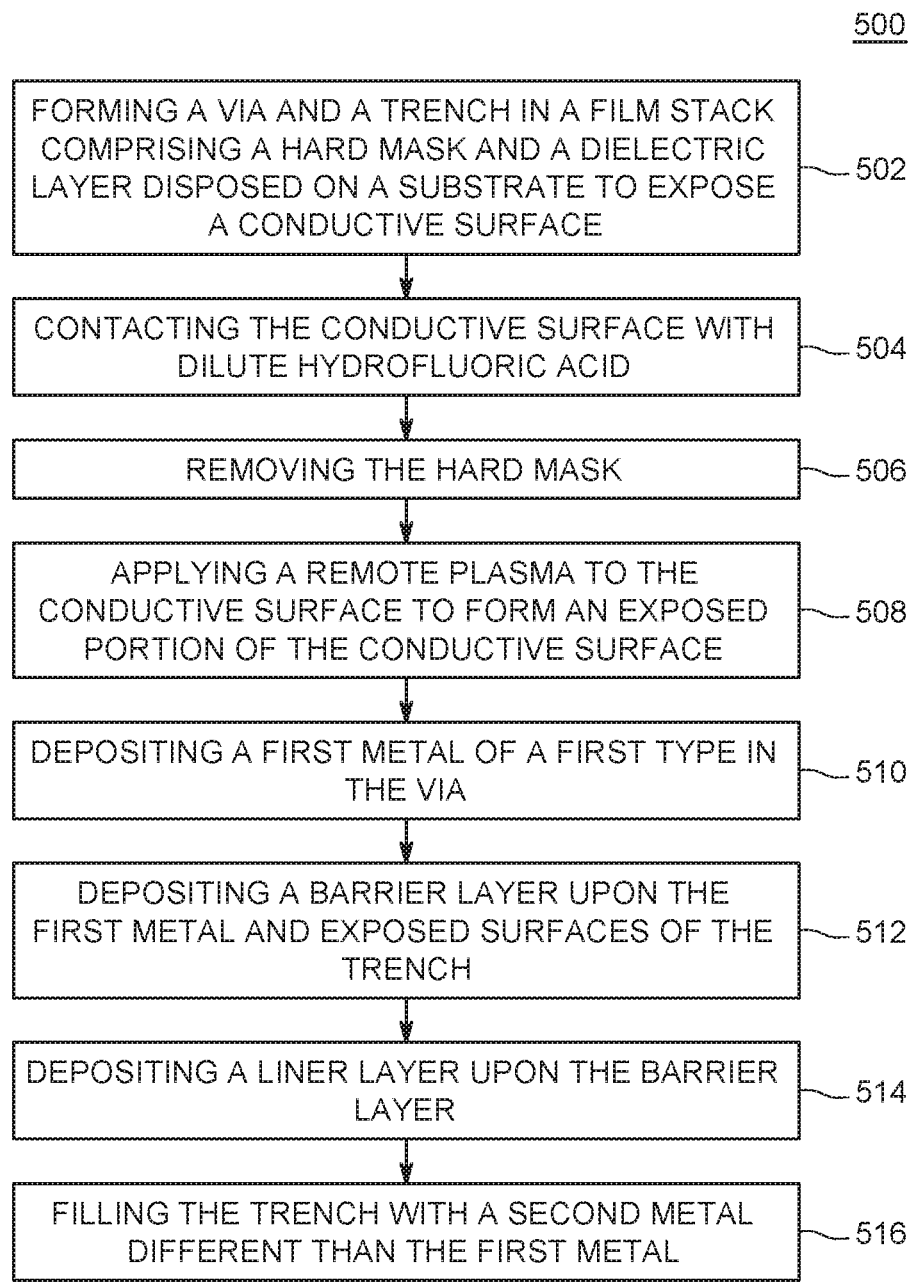
FIG. 5 illustrates a method of forming an interconnect according to one embodiment of the present disclosure.

Referring now to FIG. 5, in some embodiments, the present disclosure includes a method 500 of forming an interconnect, including: at block 502 forming a via and a trench in a film stack comprising a hard mask and a dielectric layer disposed on a substrate to expose a conductive surface. Method 500 at block 504 includes contacting the conductive surface with dilute hydrofluoric acid. Method 500 at block 506 includes removing the hard mask. Method 500 at block 508 includes applying a remote plasma to the conductive surface to form an exposed portion of the conductive surface. Method 500 at block 510 includes depositing a first metal of a first type in the via. Method 500 at block 512 includes depositing a barrier layer upon the first metal and exposed surfaces of the trench. Method 500 at block 514 includes depositing a liner layer upon the barrier layer. Method 500 at block 516 includes filling the trench with a second metal different than the first metal. In embodiments, contacting the conductive surface with dilute hydrofluoric acid occurs prior to removing the hard mask. In embodiments, contacting the conductive surface with dilute hydrofluoric acid occurs prior to removing the hard mask, wherein removing the hard mask occurs prior to applying a remote plasma to the conductive surface to form an exposed portion of the conductive surface. In embodiments, the first metal of a first type is one of ruthenium, tungsten, cobalt, aluminum, or combinations thereof. In embodiments, the barrier layer comprises TiN or TaN. In embodiments, the liner layer comprises cobalt. In embodiments, the second metal is copper. In embodiments, a capping layer is disposed atop the second metal.

In embodiments, the present disclosure includes a method of forming an interconnect, including: sequentially (1) etching through a hard mask disposed atop a low-k dielectric layer to form a via through the low-k dielectric layer and expose a conductive surface; (2) contacting the conductive surface with dilute hydrofluoric acid to remove contaminants therefrom; (3) removing the hard mask disposed atop the low-k dielectric layer, such as by applying a wet etch; and (4) applying a remote hydrogen plasma to the conductive surface to form an exposed portion of the conductive surface.

While the foregoing is directed to embodiments of the present disclosure, other and further embodiments of the disclosure may be devised without departing from the basic scope thereof.

The invention claimed is:

1. A method of forming an interconnect, comprising:
   etching through a hard mask disposed atop a low-k dielectric layer to form a via through the low-k dielectric layer and expose a conductive surface;
   contacting the conductive surface with dilute hydrofluoric acid to remove contaminants therefrom;
   subsequently, removing the hard mask disposed atop the low-k dielectric layer;
   subsequent to removing the hard mask, applying a remote hydrogen plasma to the exposed portion of the conductive surface to clean the exposed portion of the conductive surface;
   depositing a first metal of a first type in the via;
   forming a trench in communication with the via;
   depositing a barrier layer within the trench and atop the exposed portion of the conductive surface;
   depositing a liner layer atop the barrier layer; and
   filling the trench with a second metal different than the first metal of a first type.

2. The method of claim 1, wherein contacting the conductive surface with dilute hydrofluoric acid to remove contaminants therefrom is performed before removing the hard mask disposed atop the low-k dielectric layer.

3. The method of claim 1, wherein removing the hard mask disposed atop the low-k dielectric layer is performed before applying a remote hydrogen plasma to the conductive surface to form an exposed portion of the conductive surface.

4. The method of claim 1, wherein the dilute hydrofluoric acid is a 100 to 1000:1 dHF solution.

5. The method of claim 1, wherein the first metal of a first type is one of ruthenium, tungsten, cobalt, aluminum, or combinations thereof.

6. The method of claim 1, further comprising adding a capping layer atop the second metal.

7. A method of forming an interconnect, comprising:
   forming a via and a trench in a film stack comprising a hard mask and a dielectric layer disposed on a substrate to expose a conductive surface;
   contacting the conductive surface with dilute hydrofluoric acid;
   removing the hard mask;
   applying a remote plasma to the exposed conductive surface to clean the exposed portion of the conductive surface;
   depositing a first metal of a first type in the via;
   depositing a barrier layer upon the first metal and exposed surfaces of the trench;
   depositing a liner layer upon the barrier layer; and
   filling the trench with a second metal different than the first metal.

8. The method of claim 7, wherein contacting the conductive surface with dilute hydrofluoric acid occurs prior to removing the hard mask.

9. The method of claim 7, wherein contacting the conductive surface with dilute hydrofluoric acid occurs prior to removing the hard mask, and wherein removing the hard mask occurs prior to applying a remote plasma to the conductive surface to form an exposed portion of the conductive surface.

10. The method of claim 7, wherein the first metal of a first type is one of ruthenium, tungsten, cobalt, aluminum, or combinations thereof.

11. The method of claim 7, wherein the barrier layer comprises TiN or TaN.

12. The method of claim 7, wherein the liner layer corn cobalt.

13. The method of claim 7, wherein the second metal is copper.

14. The method of claim 7, wherein a capping layer is disposed atop the second metal.

15. A non-transitory computer readable medium having instructions stored thereon that, when executed, cause a method a method of forming an interconnect, comprising:
   etching through a hard mask disposed atop a low-k dielectric layer to form a via through the low-k dielectric layer and expose a conductive surface;
   contacting the conductive surface with dilute hydrofluoric acid to remove contaminants therefrom;
   subsequently, removing the hard mask disposed atop the o k dielectric layer;
   subsequent to removing the hard mask, applying a remote hydrogen plasma to the exposed portion of the conductive surface to clean the exposed portion of the conductive surface;
   depositing a first metal of a first type in the via;
   forming a trench in communication with the via;
   depositing a barrier layer within the trench and atop the exposed portion of the conductive surface;
   depositing a liner layer atop the barrier layer; and
   filling the trench with a second metal different than the first metal of a first type.

* * * * *

UNITED STATES PATENT AND TRADEMARK OFFICE
CERTIFICATE OF CORRECTION

PATENT NO. : 11,164,780 B2
APPLICATION NO. : 16/435121
DATED : November 2, 2021
INVENTOR(S) : Shi You et al.

It is certified that error appears in the above-identified patent and that said Letters Patent is hereby corrected as shown below:

In the Specification

Column 2, Line 65, delete "disclosure," and insert --disclosure.--
Column 3, Line 35, delete "FIG. 3," and insert --FIG. 3.--
Column 4, Line 29, delete "SIC)," and insert --SiC),--
Column 5, Line 3, delete "VV," and insert --W,--
Column 6, Line 55, delete "Cu©" and insert --CuO--
Column 7, Line 42, delete "Inato" and insert --Inc. to--
Column 9, Line 2, delete "302. 304" and insert --302, 304--

In the Claims

Column 12, Line 40, delete "corn" and insert --compromises--
Column 12, Line 55, delete "o k" and insert --low-k--

Signed and Sealed this
Eighth Day of February, 2022

Drew Hirshfeld
*Performing the Functions and Duties of the*
*Under Secretary of Commerce for Intellectual Property and*
*Director of the United States Patent and Trademark Office*